(12) United States Patent
Tateishi et al.

(10) Patent No.: US 6,743,033 B2
(45) Date of Patent: Jun. 1, 2004

(54) CONTACTOR FOR SEMICONDUCTOR DEVICE AND CONTACT METHOD

(75) Inventors: Masaru Tateishi, Kawasaki (JP); Toshihisa Watanabe, Kawasaki (JP); Hiroyuki Tokuyama, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/162,893

(22) Filed: Jun. 6, 2002

(65) Prior Publication Data
US 2003/0096523 A1 May 22, 2003

(30) Foreign Application Priority Data
Nov. 20, 2001 (JP) ......................................... 2001-355179

(51) Int. Cl.[7] ............................................. H01R 11/22
(52) U.S. Cl. ........................................ 439/266; 439/331
(58) Field of Search ................................ 439/259, 331, 439/266, 525, 526, 71, 73, 70, 72, 330, 267, 268, 263, 264

(56) References Cited

U.S. PATENT DOCUMENTS

| 3,874,768 | A | * | 4/1975 | Cutchaw | 439/72 |
|---|---|---|---|---|---|
| 5,192,215 | A | * | 3/1993 | Grabbe et al. | 439/73 |
| 5,443,396 | A | * | 8/1995 | Tokushige | 439/266 |
| 5,504,435 | A | * | 4/1996 | Perego | 324/755 |
| 6,065,986 | A | * | 5/2000 | Mizuta | 439/266 |
| 6,109,944 | A | * | 8/2000 | Takeyama | 439/266 |
| 6,213,803 | B1 | * | 4/2001 | Kato et al. | 439/266 |
| 6,350,137 | B1 | * | 2/2002 | Shimada | 439/266 |
| 6,354,856 | B1 | * | 3/2002 | Shimada | 439/266 |
| 6,447,318 | B1 | * | 9/2002 | Okamoto | 439/266 |
| 6,540,537 | B1 | * | 4/2003 | Kawamura et al. | 439/266 |

FOREIGN PATENT DOCUMENTS

| JP | 5-28049 | 4/1993 |
|---|---|---|
| JP | 11-297442 | 10/1999 |
| JP | 2000-195630 | 7/2000 |

* cited by examiner

Primary Examiner—Ross Gushi
(74) Attorney, Agent, or Firm—Armstrong, Kratz, Quintos, Hanson & Brooks, LLP (57) ABSTRACT

A contactor for a semiconductor device comprises a placing table, lower side contactors, upper side contactors and a pressure part. A semiconductor device is placed on the placing table. The lower side contactors contact terminals of the semiconductor device from lower sides when the semiconductor device is placed on the placing table. The upper side contactors have heads that can move up and down with respect to the terminals of the semiconductor device placed on the placing table. The pressure part moves the heads toward the terminals of the semiconductor device by pressing the upper side contactors so as to elastically deform the upper side contactors.

11 Claims, 8 Drawing Sheets

CONTACTOR FOR SEMICONDUCTOR DEVICE AND CONTACT METHOD

BACKGROUND OF THE INVENTION

1. Field of the Invention

The present invention relates to a contactor for a semiconductor device, and more particularly, to a contactor for a semiconductor device having a two-point-contact type socket used for an evaluation test, a mass production test, or a burn-in test of flat package type ICs and to a contact method.

A multitude of the flat package type ICs are used for portable devices such as mobile phones, digital video cameras, digital still cameras and notebook type personal computers. Especially, narrow pitch flat package type or CSP (Chip Size Package) type power ICs, power control ICs, or flat package type ICs other than the power IC such as system LSIs have functional pins through which great current flows. In a semiconductor test, when providing a current to the functional pins, voltage drop occurs in a target supply voltage in a case where contact resistance of the contact pins is high. Accordingly, the target supply voltage is not obtained, and as a result, it is impossible to provide sufficient current to the functional pins. Thus, when performing the evaluation test, mass production test, or burn-in test of the flat package type IC, a two-point-contact type socket that helps a small current to pass through by reducing the contact resistance so as to achieve a high-precision and stable test is used.

2. Description of the Related Art

Figure 1:
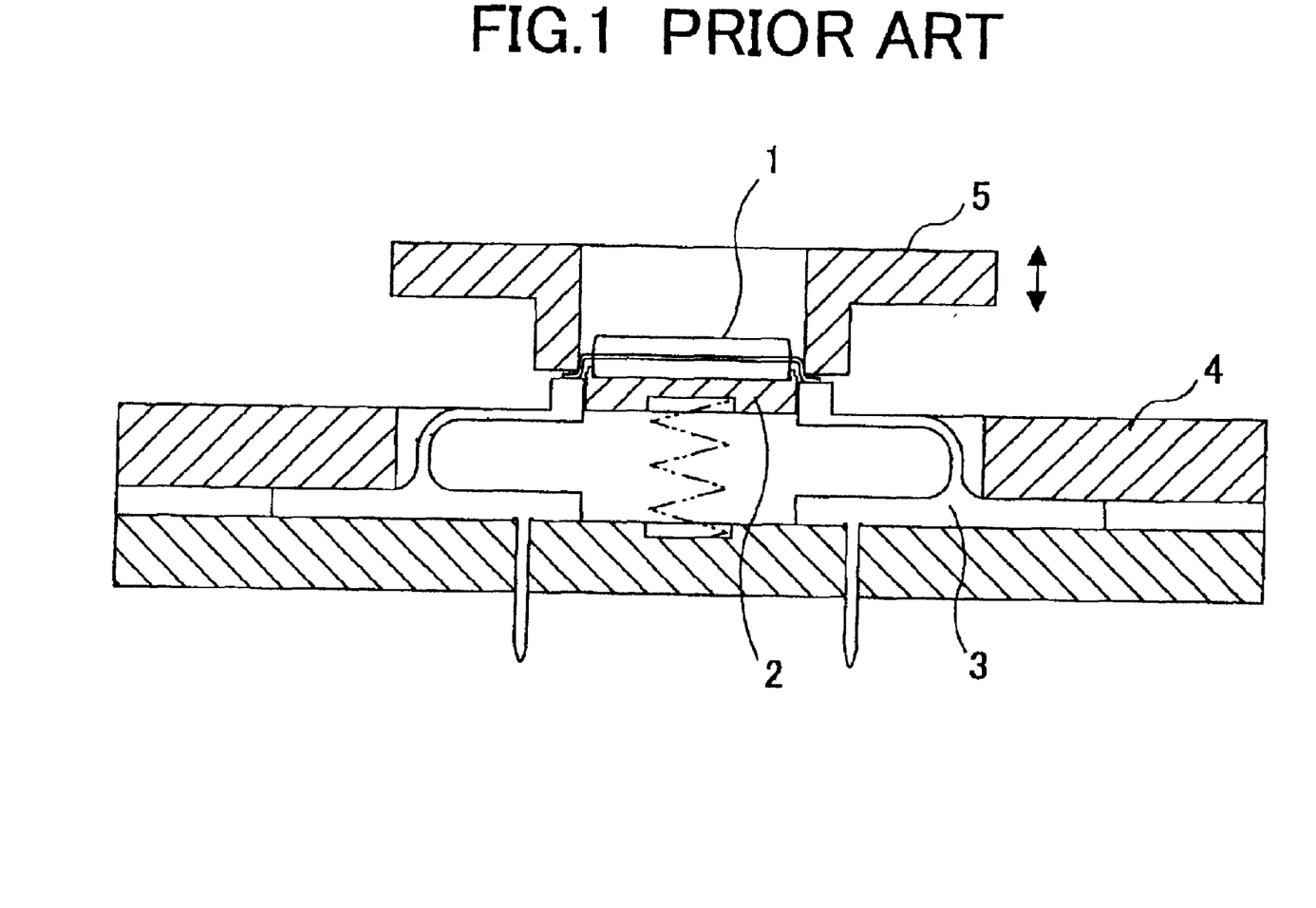
FIG. 1 is a cross-sectional view of a conventional one-point-contact type socket.

FIG. 1 shows an IC socket used for a test of conventional flat package type ICs. The IC socket has a one point type structure in which respective contactors 3 are provided for each of leads of IC 1. The contactors 3 contact undersurfaces of the leads of the flat package type IC 1. The contactors 3 are fixed to a socket body 4 in line so as to correspond to an arrangement of the leads of the IC 1. A package table 2 is arranged inside the arrangement of the contactors 3. The package table 2 is supported by a spring and can move up and down.

When the IC 1 is placed on the package table 2, each of the leads of the IC 1 is positioned directly above a contact end of the respective contactor 3. When a pressure portion 4 is moved downward, heads of a pressure portion 5 press the leads of the IC 1. The package table 2 moves downward and the leads of the IC 1 contact the contact ends of the contactors 3. By further moving the pressure portion 5 downward, the contactors 3 are elastically deformed. Stability of the contactors 3 corresponds to contact pressure between the contactors 3 and the leads of the IC 1.

The IC socket shown in FIG. 1 is called a one-point-contact type socket since each of the contactors 3 contacts a respective one of the leads of the IC 1 at one point. With regard to the one-point-contact type socket, it is conceivable that sufficient electrical contact is not obtained when foreign matter exists at the contact points or when influenced by vibration or the like. In order to prevent such cases, the two-point-contact type socket is used. The two-point-contact type socket reduces occurrence of imperfect contact due to the foreign matter, vibrations and the like by providing two contact points for each of the leads of the IC.

In the two-point-contact type socket, by insulating two contactors for a single IC lead from each other, it is possible to use one contactor for sensing (for detecting a resistance value and a current value) and to use the other contactor for forcing (for supplying voltage and current). Accordingly, it is possible to measure the current actually provided to the IC leads during the test, and to accurately control predetermined supply voltage and current that are to be provided to the IC leads.

In Japanese Laid-Open Utility Model Application No. 5-28049, a two-point-contact type socket is disclosed. The so disclosed two-point-contact type socket has a structure in which two contactors (a first contactor and second contactor) are arranged in line separately under an IC lead. The first contactor contacts an undersurface of the IC lead. A third contactor, which is provided at a cover of the socket, contacts an upper surface of the IC lead that is on the first contactor and contacts the second contactor at the same time.

Additionally, Japanese Laid-Open Patent Application No. 2000-195630 discloses another two-point-contact type socket. In the so disclosed two-point-contact type socket, two contactors are provided in a socket body and arranged in line under an IC lead. The two contactors sandwich an insulating sheet there between, or one of the two contactors has a surface on which an insulating film is formed so that the two contactors contact each other via the insulating film.

Further, Japanese Laid-Open Patent Application No. 11-297442 discloses another two-point-contact type socket. In the so disclosed two-point-contact type socket, two contactors are provided for each single IC lead. One contactor contacts an undersurface of the IC lead, and the other contactor contacts an upper surface of the IC lead by an operation of a pressure portion. A contact socket of this structure is a so-called open top type socket in which the contactor moves back upward by pressing the pressure portion and the contactor holds down the IC lead when the pressure portion is not pressed.

Compact and narrow pitch flat package type or CSP type power ICs are used in mobile devices and notebook type personal computers. In order to accurately and stably perform tests of these types of ICs, inexpensive sockets are required that can easily and positively realize two point contact, can maintain stability over a long period of time, and can be easily replaced. Further, in factories dealing with different kinds of packages, sockets are required that can be applied to mass production tests without special mechanism change of IC handlers.

However, in order to achieve two-point contact, it is necessary to make two independent contactors contact a single IC lead. With regard to this requirement, in the socket disclosed in Japanese Laid-Open Patent Application No. 05-028049, it is not easy to accurately and simultaneously make the first contactor contact the second contactor using the third contactor provided at the cover of the socket after setting the IC on the IC holding board. In addition, there is a disadvantage in that moving the IC handler toward the socket and conducting contact operations must be performed separately.

Further, in the socket disclosed in Japanese Laid-Open Patent Application No. 11-297442, the contactors separate from the leads when the pressure portion is pressed down, and the contactors contact the upper surfaces of the leads when the pressure portion is not pressed down. Accordingly, the contact operation is performed by pressing down the pressure portion before mounting the IC on the package table and terminating the press-down operation after the mounting of the IC is completed so as to let the pressure portion return to the original position. Thus, there is no flexibility of setting contact pressure since the contact pressure is a constant value set by the structure of the contactors. Furthermore, an operation of taking out the IC from the socket must be performed in a state where the pressure portion is pressed down again. For this reason, it is necessary to perform the operation of pressing down the pressure portion both when the IC handler mounts the IC to the socket and when the IC handler takes the IC out of the socket. Thus, a socket is required that enables mounting and removing of the IC to be performed easily.

SUMMARY OF THE INVENTION

A general object of the present invention is to provide an improved and useful semiconductor device contactor and contact method that enable placing and taking out of the IC to be performed by the same operation as that of a conventional one point contact socket, and can achieve positive two point contact.

In order to achieve the above-mentioned object, there is provided according to one aspect of the present invention, a contactor for a semiconductor device, comprising: a placing table on which a semiconductor device is placed; lower side contactors contacting terminals of the semiconductor device from a lower side when the semiconductor device is placed on the placing table; upper side contactors having heads that are movable up and down with respect to the terminals of the semiconductor device placed on the placing table; and a pressure part moving the heads toward the terminals of the semiconductor device by pressing the upper side contactors so as to elastically deform the upper side contactors.

Additionally, there is provided according to another aspect of the present invention, a contact method that obtains electrical contact with terminals of a semiconductor device, comprising the steps of: placing the semiconductor device on a placing table from above the placing table through an opening of a pressure part, and at the same time, making the terminals of the semiconductor device contact lower side contactors arranged around the placing table; lowering the pressure part so as to press upper side contactors, elastically deforming the upper side contactors, and moving heads of the upper side contactors toward the terminals of the semiconductor device; and making the heads of the upper side contactors contact the terminals of the semiconductor device on a side opposite to the lower side contactors and giving contact pressure to the terminals of the semiconductor device by putting the terminals between the lower side contactors and the upper side contactors.

According to the present invention, it is possible to achieve two point contact merely by pressing the upper side contactors by the pressure part and elastically deforming the upper side contactors so as to put the terminals of the semiconductor device between the upper side contactors and the lower side contactors. Thus, a motion of contact is only pressing the pressure part so as to lower the pressure part. Therefore, it is possible to achieve accurate and positive two-point contact by the same operation as that of a conventional one-point-contact type socket.

Other objects, features and advantages of the present invention will become more apparent from the following detailed description when read in conjunction with the following drawings.

DETAILED DESCRIPTION OF THE PREFERRED EMBODIMENTS

A description will be given of embodiments of the present invention with reference to drawings.

Figure 2:
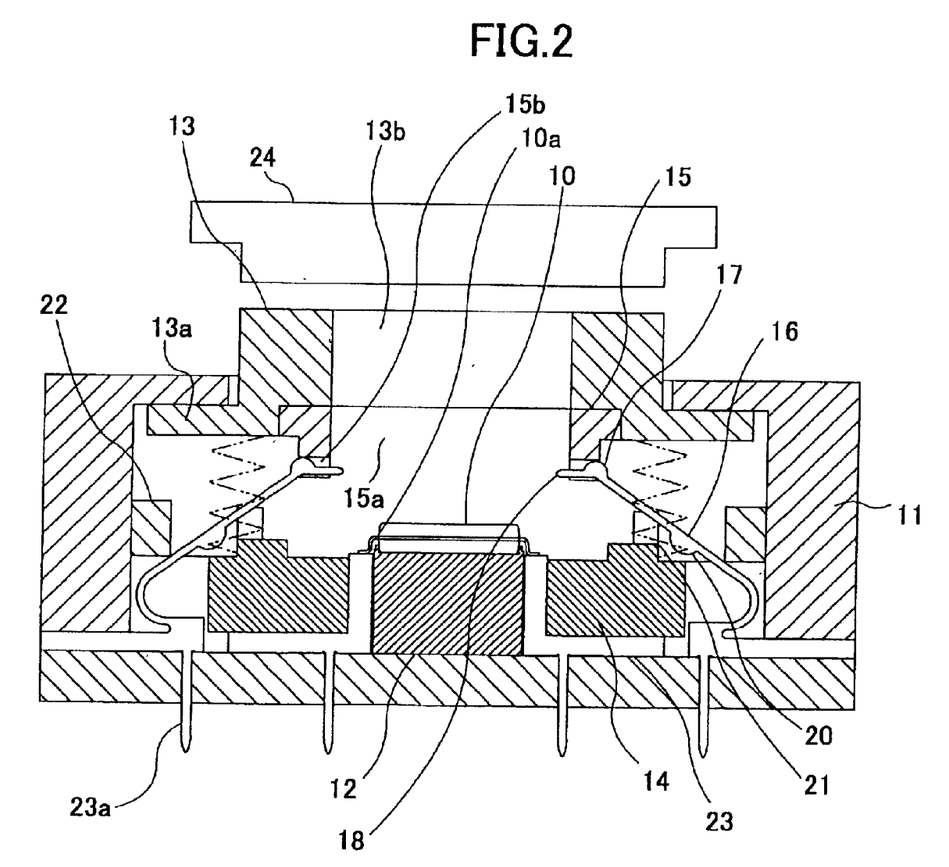
FIG. 2 is a cross-sectional view of an IC socket according to a first embodiment of the present invention.

FIG. 2 is a cross-sectional view of an IC socket as a contactor for a semiconductor device according to a first embodiment of the present invention. The IC socket shown in FIG. 2 includes a socket body 11, a package table 12, a pressure part 13, and a contactor fixing part 14. The package table 12 is fixed in the center of the bottom of the socket body 11. Lower side contactors 23 are arranged around the package holding part so as to correspond to leads 10a of a flat package type IC placed on the package table 12. That is, the lower side contactors 23 are arranged in the same arrangement as the leads 10a of the IC 10 so that the lower side contactors 23 are provided for the respective leads 10a on one-to-one basis. The package table 12 functions as a placing board for placing a semiconductor device.

The lower side contactor 23 is formed by a generally L-shaped thin metal tab. A contact part 23a having a pin shape extends from the lower side contactor 23. The contact part 23a extends to an outside of the socket body 11 by penetrating a bottom plate of the socket body 11. The lower side contactor 23 is fixed on the bottom of the socket body by the contactor fixing part 14. A head of the lower side contactor 23 is positioned so as to contact the lead 10a of the IC 10 in a state where the IC 10 is placed on the package table 12. The lower side contactor 23 functions as a first contactor that contacts the lead 10a of the IC 10.

Figure 3:
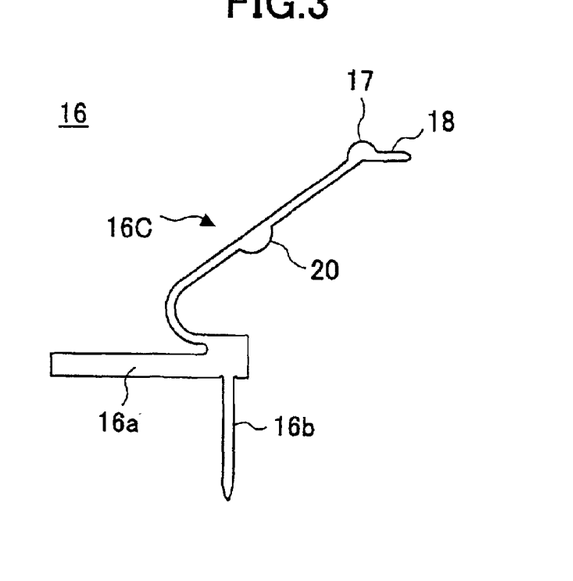
FIG. 3 is a side view of an upper side contactor shown in FIG. 2.

Upper side contactors 16 are arranged around the lower side contactors 23. Each of the upper side contactors 16 is formed of a metal strip having high elasticity and high hardness such as beryllium copper, for example. Contact resistance of the upper side contactors 16 can be reduced by plating surfaces of the upper side contactors 16 with nickel (Ni), gold (Au), or the like. As shown in FIG. 3, the upper side contactors 16 include a base 16a, a contact part 16b that extends downward from the base 16a, and an arm 16c that extends diagonally upward from the base 16a. A middle protrusion 20 is formed between a root and a head 18 of the arm 16c. The head 18 functions as a second contacting part that contacts the lead 10a of the IC 10.

An opening is formed at a top of the socket body 11. The pressure part 13 is inserted in the opening and supported by springs (shown by two-dot chain lines) so that the pressure part 13 can move up and down. When the pressure part 13 is not pressed, a flange part 13a contacts the top of the socket body 11. The position of the pressure part 13 thereof as shown in FIG. 2 is the highest position for the pressure part 13.

An opening 13b is formed at the center of the pressure part 13. Additionally, a pressure member 15 is attached to an undersurface of the pressure part 13. Grooves 15b are formed at the lower part of the pressure member 15 so as to correspond to the arrangement of the upper side contactors 16. The heads 18 of the upper side contactors 16 are inserted and arranged in the grooves 15b. The pressure member 15 is formed by a material having good insulation property and relatively high hardness such as polyimide resin, for example, since the heads 18 of the upper side contactors 16 contact the pressure member 15. An opening 15a is also formed at the center of the pressure member 15 so as to provide a continuance to the opening 13b of the pressure part 13.

The IC 10 can be put on the package table 12 through the opening 13b of the pressure part 13 and the opening 15a of the pressure member 15. Further, protrusions are provided on an upper surface of the package table 12 so as to receive and position a body of the IC 10.

Next, a description will be given of a contact operation of the IC socket having the above-mentioned structure.

The IC socket shown in FIG. 2 is fixed to a test board (not shown) through the contact parts 16b of the upper side contactors 16 and the contact parts 23a of the lower side contactors 23. Then, a press part 24, which is a part of a pressing mechanism, is arranged over the pressure part 13 such that the press part 24 can move up and down.

When placing the IC 10 on the IC socket, the press part 24 is positioned upward and away from the pressure part 13, and the opening 13b is opened widely. Thus, it is possible to drop down the IC 10 on the package table 12 through the openings 13b and 15a by supporting IC 10 with a handler.

Figure 4:
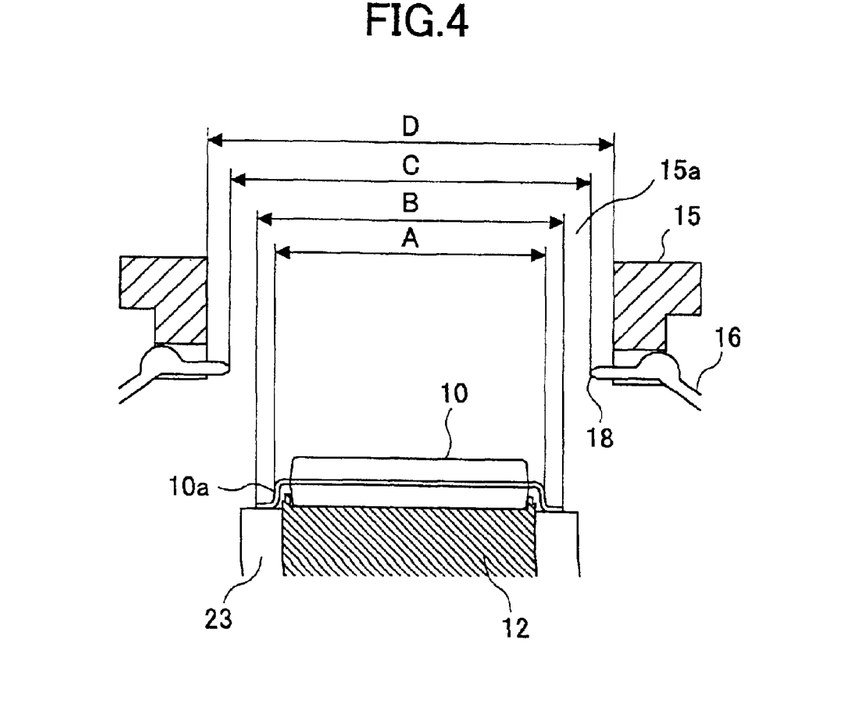
FIG. 4 is a schematic diagram showing relationships among a size of an IC, a size of an opening of a pressure member, and a distance between heads of upper side contactors on the right and the left.

FIG. 4 is a schematic diagram showing relationships among a size of the IC 10, a size of the opening 15a, and a distance between the heads 18 of the upper side contactors 16. The size D of the opening 15a is larger than the distance C between the heads 18 of the upper side contactor 16. In addition, a distance B between ends of the lead 10a of the IC 10 is smaller than the distance C between the heads 18 of the upper side contactors 16. Accordingly, it is possible to drop down the IC 10 on the package table 12 through the opening 15a and a space between the heads 18 of the upper side contactors 16. Further, the distance C between the heads 18 of the upper side contactors 16 decreases as pressure protrusions 17 are pressed down by the pressure member 15. Finally, the distance C remains larger than a distance A between vertical parts of the leads 10a of the IC 10 and becomes smaller than the distance B between the ends of the leads 10a of the IC 10.

The IC 10 that is dropped down on the package table 12 is guided by the protrusions on the upper surface of the package table 12 and placed at a predetermined position. In this state, the leads 10a of the IC 10 lightly contact corresponding tops of lower side contactors 23.

When the IC 10 is placed on the package holding part 12, the pressing mechanism is operated such that the press part 24 descends and the pressure part 13 is pressed down. As the pressure part 13 descends, the pressure member 15 also descends. Therefore, the arms 16c of the upper side contactors 16, the heads 18 of which contact the pressure member 15, move downward by the bending of the root of the upper side contactors 16. On this occasion, since the arms 16c descend with an arc-like rotational motion centered on the roots, the heads 18 of the upper side contactors 16 move downward and toward the inside (toward the IC 10, namely). At the same time, the middle protrusions 20 that are provided in the vicinity of the center of the arms 16c move toward the inside and descend.

A step part 21 is arranged under the middle protrusion that is provided in the vicinity of the center of the arm 16c. The step part 21 is formed on the contactor fixing part 14. Thus, when the arms 16c of the upper side contactors 16 wholly descend toward the inside, the middle protrusions 20 contact a sidewall of the step part 21.

Figure 5:
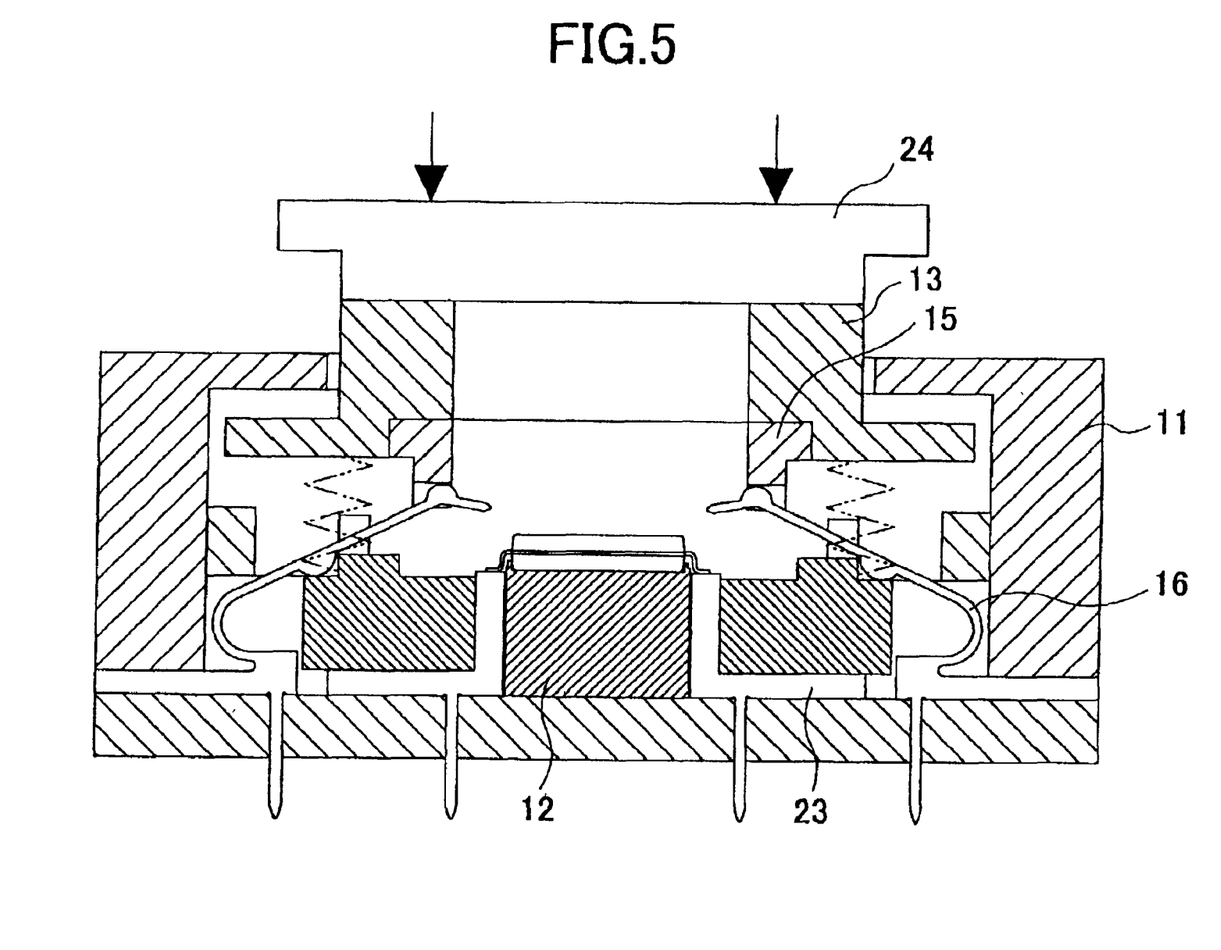
FIG. 5 is a cross-sectional view of the IC socket in a state where protrusions contact sidewalls of step parts.

FIG. 5 is a cross-sectional view of the IC socket in a state where the middle protrusions 20 contact the sidewall of the step part 21. As described later, the heads 18 of the upper side contactors 16 contact the leads 10a of the IC 10 in a state where the pressure part 13 is completely pressed down to the lowest position. In a state shown in FIG. 5, the pressure part 13 is positioned mid-way between the highest position and the lowest position. In this state, the heads 18 of the upper side contactors 16 are positioned almost vertically over the leads 10a of the IC 10.

The arms 16c rotationally turn about the respective roots thereof until the middle protrusions 20 of the upper side contactors 16 contact the sidewall of the step part 21 of the contactor fixing part 14. After the contact, only head-side parts of the contactors 16 from the heads 18 to the middle protrusions 20 rotationally turn centered on the respective middle protrusions 20. Accordingly, the parts of the arms 16c that turn become short. Therefore, the heads 18, which have been moving diagonally downward and inward with respect to the leads 10a of the IC 10, start to move (descend) almost vertically with respect to the leads 10a.

Figure 6:
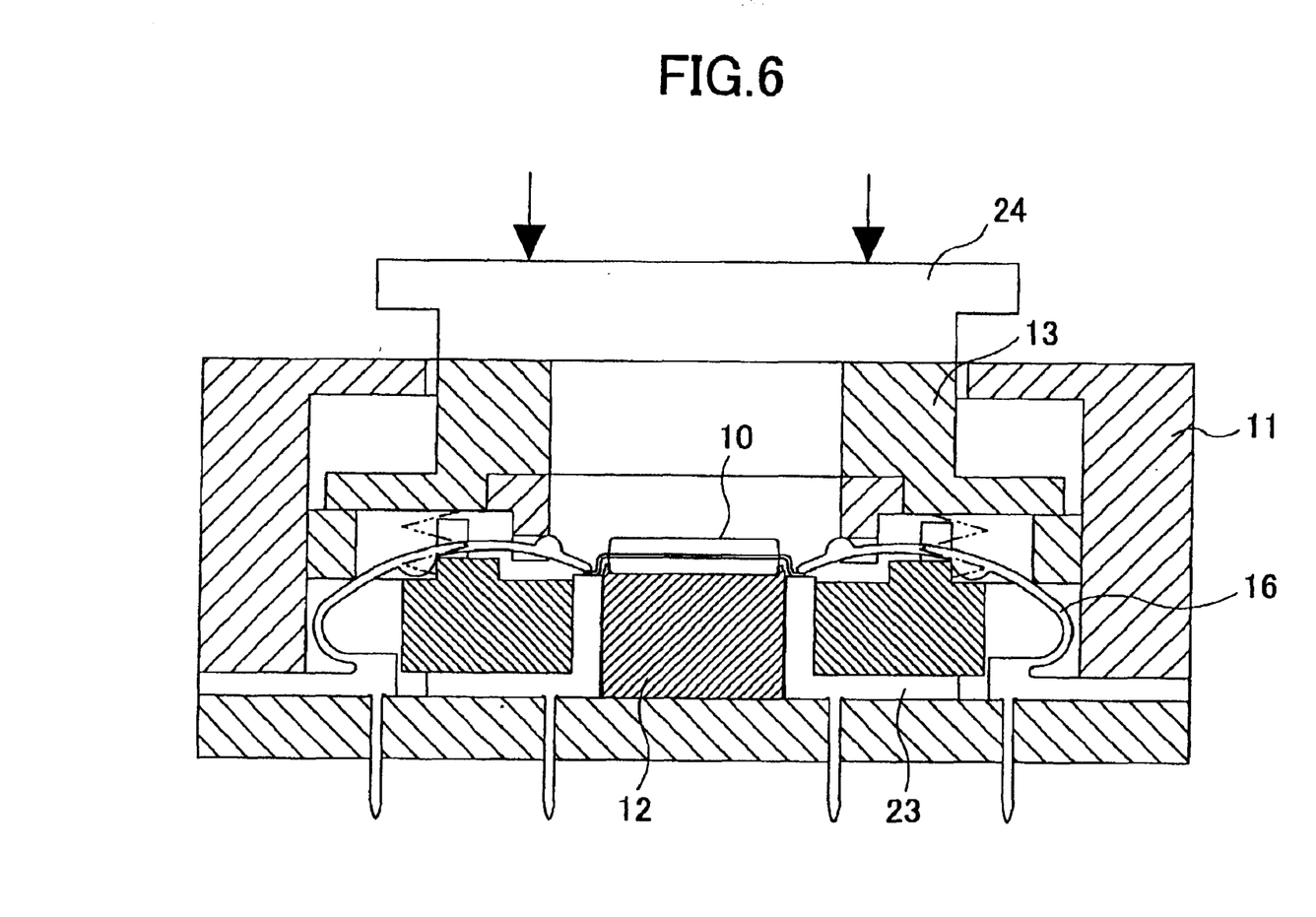
FIG. 6 is a cross-sectional view of the IC socket in a state where a pressure portion reaches the lowest position.

FIG. 6 shows a final state where the press part 24 further descends and presses down the pressure part 13 from the state shown in FIG. 5. In the state shown in FIG. 6, the pressure part 13 contacts stoppers 22 provided on inside walls of the socket body 11 and the pressure part 13 reaches the lowest position.

The heads 18 of the upper side contactors 16 contact the corresponding leads 10a of the IC 10 slightly before the pressure part 13 reaches the lowest position. Until the pressure part 13 reaches the lowest position, the parts of the contactors 16 between the heads 18 and the middle protrusions 20 are bent according to elastic deformation since the pressure protrusions 17 are pressed. On this occasion, the leads 10a of the IC 10 are put between top parts of the lower side contactors 23 (first contact parts) and the heads 18 (second contact parts) of the upper side contactors 16. Thus, contact pressure is applied to the leads 10a. Appropriate contact pressure of approximately 20–50 g/pin can be obtained by adjusting the shape and size of the arms 16c of the upper side contactors 16.

Figure 7:
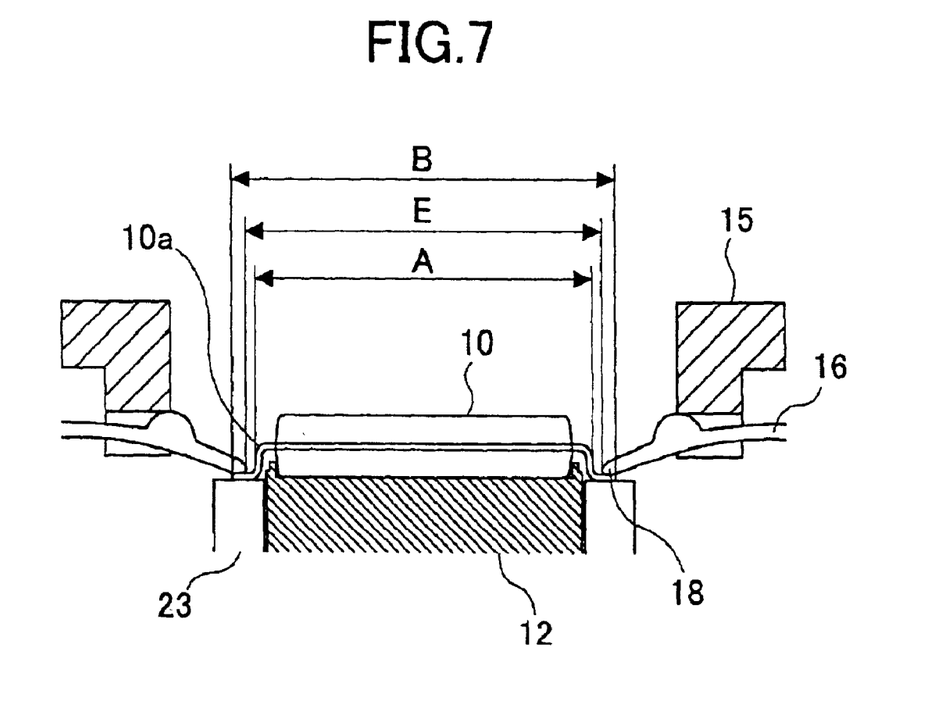
FIG. 7 is a schematic diagram showing physical relationships between the heads of the upper side contactors and leads of the IC in the state shown in FIG. 6.

FIG. 7 is a schematic diagram showing physical relationships between the heads 18 of the upper side contactors 16 and the leads 10a of the IC 10 in the state shown in FIG. 6. A distance E between the heads 18 of the upper side contactors 16 on both sides is adjusted so as to remain larger than the distance A between the vertical parts of the leads 10a and become smaller than the distance B between the ends of the leads 10a of the IC 10. The heads 18 press horizontal parts of the leads 10a of the IC 10.

After a desired test is performed on the IC 10 while maintaining appropriate contact pressure, when the press part 24 of the pressing mechanism is raised, the pressure part 13 ascends according to a spring force. Based on this, the upper side contactors 16 return to original shapes according to elastic restoring forces of the arms 16c. Accordingly, the IC socket returns to the state shown in FIG. 2.

As mentioned above, the IC socket according to this embodiment has the upper side contactors 16 to which the respective middle protrusions 20 are provided. Since the middle protrusions 20 contact the sidewalls of the step parts 21 on the halfway of the upper side contactors 16 being pressed to bend, the upper side contactors 16 are prevented from moving much further toward the inside. In other words, a distance between the head 18 and the center of the rotational turning is long until each of the middle protrusions 20 contacts the sidewall of the step part 21. For this reason, the moving distance (moving distance in a horizontal direction) of each of the heads 18 toward the inside is large. On the other hand, each of the middle protrusions becomes the center of the rotational turning and the distance between the head 18 and the center of the rotational turning becomes small after each of the middle protrusions 20 contacts the sidewall of the step part 21. For this reason, the moving distance of each of the heads 18 toward the inside becomes small.

That is, an operation of each of the heads 18 of respective upper side contactors 16 is a two-step operation: each of the heads 18 of the respective upper side contactors 16 moves toward the inside and in a horizontal direction by describing a large arc before each of the middle protrusions 20 contacts the sidewall of the step part 21; after each of the middle protrusions 20 contacts the step part 21, each of the middle protrusions becomes a center of the rotational turning and each of the heads 18 contacts the respective leads 10a of the IC 10 by describing a small arc. Thereby, it is possible to easily achieve a complex operation such that a distance of a horizontal displacement of each of the heads 18 of the respective upper side contactors 16 is made large in a first operation, and the distance of the horizontal displacement of each of the heads 18 is made small in a second operation by a simple operation of merely pressing each of the pressure protrusions 17 of the upper side contactors 16.

The distance of each of the horizontal parts of the respective leads 10a of the IC 10 is very small. For this reason, it is preferable that the moving distance of each of the heads 18 in the horizontal direction be made as small as possible when the heads 18 of the upper side contactors 16 are further pressed from a state where the heads 18 contact the leads 10a so as to obtain contact pressure. At this point, it is possible to easily obtain an appropriate contact pressure by the upper side contactors 16 according to the present invention since the heads 18 only move almost vertically after the middle protrusions 20 contact the sidewalls of the step parts 21.

The IC socket according to the present invention is the two-point-contact type socket in which the leads 10a of the IC 10 are contacted from up and down sides by the upper side contactors 16 and the lower side contactors 23, respectively. Accordingly, it is possible to use either the upper side contactors 16 or the lower side contactors 23 for sensing, and to use the other for forcing so that supply voltage or current to the leads 10a of the IC 10 can be controlled. Additionally, the contact pressure is obtained by putting each of the leads 10a between the upper side contactor 16 and the lower side contactor 23. Therefore, it is possible to actually reduce the contact pressure since the contact pressure is shared by the two contactors.

Further, the motion of contact by placing the IC 10 on the IC socket according to the present invention is the same as the operation of the conventional one-point-contact type socket. Thus, it is not necessary to remodel or change a handler that moves and places an IC. Thus, it is possible to perform high precision and stable semiconductor tests by two-point contact by merely exchanging the conventional one-point-contact type socket for the IC socket according to the present invention.

Figure 8:
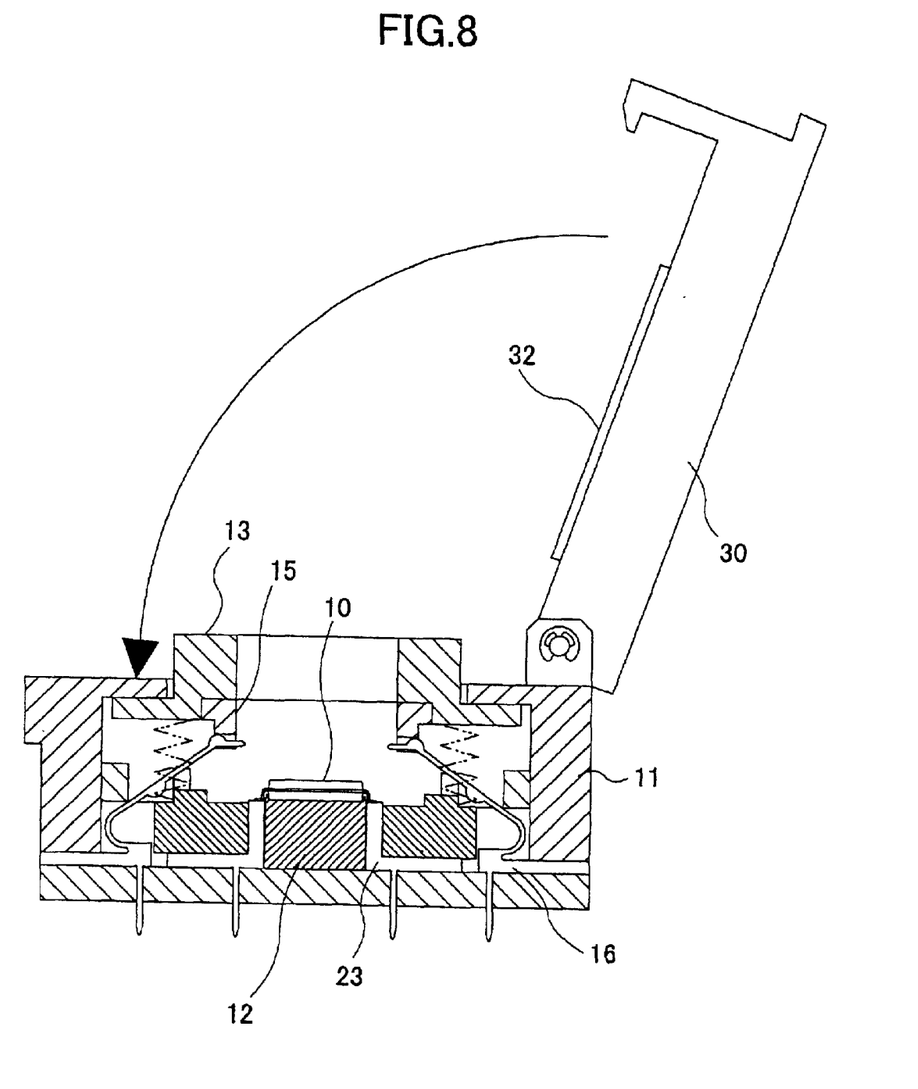
FIG. 8 is a cross-sectional view showing a state where a manual operation type press lid is attached to a socket body shown in FIG. 2.

FIG. 8 is a cross-sectional view of an IC socket in a case where a manual operation type press lid 30 is provided for the IC socket according to the present invention. The press lid 30 is supported on one side of the top of the socket body 11 so as to be able to rotate. A pressure portion 32, which corresponds to the press part 24 in FIG. 2, is provided in the center of the press lid 30.

In the IC socket shown in FIG. 8, it is possible to put the IC 10 in the IC socket and to take out the IC 10 from the IC socket by opening the press lid 30. By closing the press lid 30 with the IC 10 placed on the package table 12, a contact operation can be achieved since the pressure part 13 is pressed down by the pressure portion 32 of the press lid 30.

As mentioned above, the IC socket according to the present invention can achieve both an automatic type that performs the contact operation by pressing down the pressure part 13 by the pressing mechanism as shown in FIG. 2, and a manual type that performs the contact operation manually by providing the press lid 30 as shown in FIG. 8.

Figure 9:
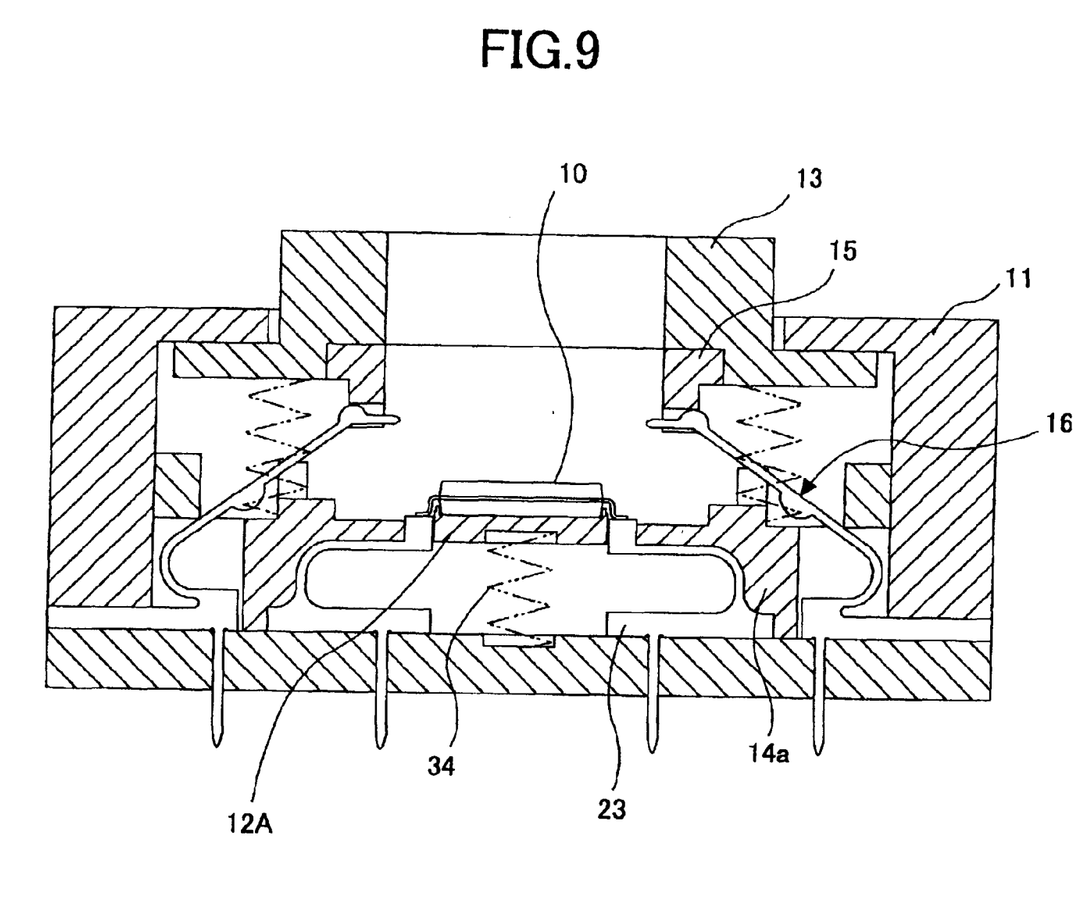
FIG. 9 is a cross-sectional view of an IC socket according to a second embodiment of the present invention.

Next, a description will be given of an IC socket according to a second embodiment of the present invention with reference to FIG. 9. In FIG. 9, those parts that are the same as those corresponding parts in FIG. 2 are designated by the same reference numerals and a description thereof will be omitted.

In the IC socket according to the second embodiment of the present invention, the structure relating to the upper side contactors 16 is the same as that of the IC socket according to the above-described first embodiment. The IC socket according to the second embodiment and the IC socket according to the first embodiment differ in the package table 12 and supporting structure of the lower side contactors 23.

In the IC socket according to this embodiment, a package table 12A is supported above a bottom plate of a socket body 11 by a spring 34 such as a coil spring or the like. An elastic body such as rubber or the like may be used instead of the spring 34. Accordingly, the package table 12A can be moved downward against the spring force of the spring 34. In addition, lower side contactors 23 are attached to contactor fixing parts 14A such that heads of the lower side contactors 23 can move downward.

In the above-mentioned structure, when heads 18 of upper side contactors 16 are pressed against leads 10a of an IC 10, the leads 10a of the IC 10 can move downward against the spring force of the spring 34 and spring force of the lower side contactors 23. Thus, leads 10a receive contact pressure in a state where the spring force of the upper side contactors 16, the spring force of the spring 34 and the spring force of the lower side contactors 23 are balanced. Therefore, even when a distance of vertical movement of the heads 18 of the upper side contactors 16 is made large, it is possible to obtain smaller contact pressure than the contact pressure in the first embodiment. As a result, it is possible to set the contact pressure more accurately.

Further, in the above-mentioned embodiments, the middle protrusion 20 is provided in the vicinity of the center of the arm 16c of the upper side contactor 16. However, the number of the middle protrusions 20 is not limited to one, and a plurality of the middle protrusions 20 may be provided. In this case, a plurality of step parts 21 are provided so as to correspond to the number of the middle protrusions 20. Thus, it is possible to control the movement of the heads 18 of the upper side contactors 16 more accurately.

The present invention is not limited to the specifically disclosed embodiments, and variations and modifications may be made without departing from the scope of the present invention.

The present application is based on Japanese priority application No. 2001-355179 filed on Nov. 20, 2001, the entire contents of which are hereby incorporated by reference.

What is claimed is:

1. A contactor for a semiconductor device, comprising:
   a placing table on which the semiconductor device is placed;
   lower side contactors contacting terminals of the semiconductor device from a lower side when the semiconductor device is placed on the placing table;
   upper side contactors having heads that are movable up and down with respect to the terminals of the semiconductor device placed on the placing table; and
   a pressure part for moving the heads toward the terminals of the semiconductor device by pressing the upper side contactors so as to elastically deform the upper side contactors and rotationally turn the upper side contactors about a plurality of points along each said upper side contactor.

2. A contactor for a semiconductor device, comprising:
   a placing table on which the semiconductor device is placed;
   lower side contactors contacting terminals of the semiconductor device from a lower side when the semiconductor device is placed on the placing table;
   upper side contactors having heads that are movable up and down with respect to the terminals of the semiconductor device placed on the placing table; and
   a pressure part for moving the heads toward the terminals of the semiconductor device by pressing the upper side contactors so as to elastically deform the upper side contactors, wherein
      the lower side contactors and the upper side contactors are separate parts and insulated from each other.

3. The contactor for the semiconductor device as claimed in claim 1, wherein the lower side contactors are elastically deformable and contacting parts of the lower side contactors that contact the terminals are moveable up and down.

4. A contactor for a semiconductor device, comprising:
   a placing table on which the semiconductor device is placed;
   lower side contactors contacting terminals of the semiconductor device from a lower side when the semiconductor device is placed on the placing table;
   upper side contactors having heads that are movable up and down with respect to the terminals of the semiconductor device placed on the placing table; and
   a pressure part for moving the heads toward the terminals of the semiconductor device by pressing the upper side contactors so as to elastically deform the upper side contactors, wherein
      the pressure part is positioned above the placing table and has an opening larger than an outer dimension of the semiconductor device.

5. A contactor for a semiconductor device, comprising:
   a placing table on which the semiconductor device is placed;
   lower side contactors contacting terminals of the semiconductor device from a lower side when the semiconductor device is placed on the placing table;
   upper side contactors having heads that are movable up and down with respect to the terminals of the semiconductor device placed on the placing table; and
   a pressure part for moving the heads toward the terminals of the semiconductor device by pressing the upper side contactors so as to elastically deform the upper side contactors, wherein
      each of the upper side contactors has a base part and an arm part; the head is formed at an end of the arm part; and the arm part is elastically rotatable centered on a connecting part connecting the arm part with the base part.

6. The contactor for the semiconductor device as claimed in claim 5, wherein the arm part has a press protrusion adjacent to the head and the arm part rotationally turns such that the head moves toward the corresponding terminal of the semiconductor device when the press protrusion is pressed down by the pressure part.

7. The contactor for the semiconductor device as claimed in claim 6, wherein the press protrusions are received by respective grooves formed on a press member attached to the pressure part, the press member being formed by an insulating material having abrasion resistance.

8. The contactor for the semiconductor device as claimed in claim 5, wherein the arm part has at least one middle protrusion between the press protrusion and the connecting part; a step part is provided beneath the middle protrusion; the middle protrusion serves as a center of rotational turning so that the head rotationally turns when the arm part rotationally turns and the middle protrusion contacts the step part.

9. The contactor for the semiconductor device as claimed in claim 5, further comprising a protrusion functioning as a supporting point for rotationally turning the arm part at a position closer to the semiconductor device than the base part.

10. A contact method that obtains electrical contact with terminals of a semiconductor device, comprising the steps of:
    placing the semiconductor device on a placing table from above the placing table through an opening of a pressure part, and at the same time, making the terminals of the semiconductor device contact lower side contactors arranged around the placing table;
    lowering the pressure part so as to press upper side contactors, elastically deforming the upper side contactors, and moving heads of the upper side contactors toward the terminals of the semiconductor device; and
    making the heads of the upper side contactors contact the terminals of the semiconductor device on a side opposite to the lower side contactors and giving contact pressure to the terminals of the semiconductor device by putting the terminals between the lower side contactors and the upper side contactors.

11. The contact method as claimed in claim 10, wherein the step of moving the heads of the upper side contactors further comprises the step of making middle protrusions provided for the respective upper side contactors contact a step part and further elastically deforming the upper side contactors between the middle protrusions and the heads.

* * * * *